United States Patent [19]

Akahori et al.

[11] Patent Number: 5,081,229

[45] Date of Patent: * Jan. 14, 1992

[54] POLYIMIDE HAVING EXCELLENT THERMAL DIMENSIONAL STABILITY

[75] Inventors: Kiyokazu Akahori; Hideki Kawai, both of Kobe; Hirosaku Nagano, Ootsu, all of Japan

[73] Assignee: Kanegafuchi Chemical Ind. Co., Ltd., Osaka, Japan

[ * ] Notice: The portion of the term of this patent subsequent to Dec. 12, 2006 has been disclaimed.

[21] Appl. No.: 362,793

[22] Filed: Jun. 7, 1989

Related U.S. Application Data

[63] Continuation of Ser. No. 125,511, Nov. 25, 1987, abandoned.

[30] Foreign Application Priority Data

| Nov. 29, 1986 | [JP] | Japan | 61-285377 |
| Jan. 20, 1987 | [JP] | Japan | 62-8947 |
| Jan. 20, 1987 | [JP] | Japan | 62-8948 |
| Jan. 20, 1987 | [JP] | Japan | 62-8949 |
| Jul. 13, 1987 | [JP] | Japan | 62-174126 |
| Jul. 13, 1987 | [JP] | Japan | 62-174128 |

[51] Int. Cl.$^5$ .................................................. C08G 69/26
[52] U.S. Cl. ..................................... 528/353; 528/125; 528/126; 528/128; 528/172; 528/179; 528/182; 528/188; 528/351
[58] Field of Search ............... 528/353, 188, 125, 126, 528/128, 172, 179, 182, 351

[56] References Cited

U.S. PATENT DOCUMENTS

| 4,255,313 | 3/1981 | Antonoplos et al. | 525/426 |
| 4,299,750 | 11/1981 | Antonoplos et al. | 528/125 |
| 4,316,842 | 2/1982 | D'Alelio et al. | 528/353 |
| 4,378,400 | 3/1983 | Makino et al. | 428/220 |
| 4,405,770 | 9/1983 | Schoenberg et al. | 528/188 |
| 4,725,484 | 2/1988 | Kumagawa et al. | 528/353 |
| 4,874,835 | 10/1989 | Bordahl | 528/183 |
| 4,886,874 | 12/1989 | Nagano et al. | 528/353 |

FOREIGN PATENT DOCUMENTS

61-158025  7/1986  Japan .
61-264028  11/1986  Japan .

OTHER PUBLICATIONS

Journal of Applied Polymer Science, vol. 31, 979–995 (1986).

Primary Examiner—John Kight, III
Assistant Examiner—P. Hampton-Hightower
Attorney, Agent, or Firm—Armstrong, Nikaido, Marmelstein, Kubovcik & Murray

[57] ABSTRACT

The present invention provides a copolyimide characterized in that the copolyimide contains units represented by formulas (I) and (II)

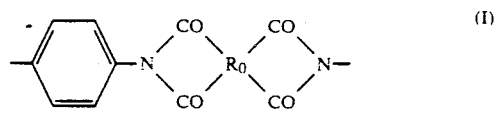

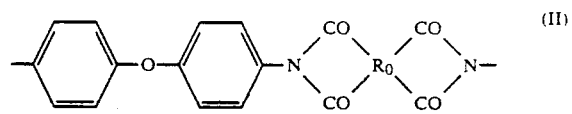

(wherein $R_0$ represents an aromatic tetracarboxylic residue).

The polyimide has excellent thermal dimensional stability, and can be fabricated by using conventional inexpensive materials.

13 Claims, No Drawings

POLYIMIDE HAVING EXCELLENT THERMAL DIMENSIONAL STABILITY

This application is a continuation of application Ser. No. 125,511, filed Nov. 25, 1987, now abandoned.

BACKGROUND OF THE INVENTION

1. Field of the Invention

The present invention relates to a polyimide resin known as a heat-resistant resin and, more particularly, to a novel copolyimide possessing excellent thermal dimensional stability and mechanical properties.

2. Description of the Prior Art

Polyimides are well known as polymers having excellent heat resistance. These polymers also have good resistance to chemicals, as well as having good electrical and mechanical characteristics. A typical polyimide is a polymer prepared by means of condensation polymerization, using 4,4'-diaminodiphenyl ether and pyromellitic dianhydride, and which is commercially available in quantity. This polymer is used as an electrical material requiring heat resistance, such as a flexible printed circuit board. Although the polymer has good mechanical characteristics such as high tensile properties, its thermal dimensional stability is poor (linear thermal expansion coefficient: $3 \times 10^{-5°}$ C.$^{-1}$), which leads to problems such as warping and curling of flexible printed circuit boards. A flexible printed circuit board comprises a polyimide film and a metal laminated thereon. Since the linear thermal expansion coefficient of the metal is less than that of the polyimide film, warping and curling occur due to changes in temperature during the fabrication and subsequent use of the flexible printed circuit boards.

Another problem caused by poor thermal dimensional stability of polyimide is warping or curling of a magnetic recording material. A recent high-density magnetic recording material is fabricated by depositing a metal on a base film. Since metal deposition is performed at a high temperature, a heat-resistant polymer such as a polyimide should preferably be used as the base film. However, since the linear thermal expansion coefficient of the polyimide film is greater than that of the metal, undesirable warping and curling inevitably occur.

Since polyimides have good heat resistance, they receive a great thermal influence. Consequently, demand has arisen for the fabrication of a polyimide which possesses excellent thermal dimensional stability. With the advent of electronics, in particular, demand for such has only become stronger.

Examples of a polyimide having excellent thermal dimensional stability are disclosed in Japanese Patent Disclosure (Kokai) Nos. 61-158025, 61-181828, 61-241335, and 61-264028. In the polyimides disclosed in Japanese Patent Disclosure (Kokai) Nos. 61-158025 and 61-264028, biphenyltetracarboxylic dianhydride and pyromellitic dianhydride (the latter is used if necessary) are used as tetracarboxylic dianhydrides, and paraphenylene diamine and 4,4'-diaminodiphenyl ether (the latter is used if necessary) are used as diamines. These materials are polycondensed to obtain the above polyimides. The polyimide disclosed in Japanese Patent Disclosure (Kokai) No. 61-181828 is prepared by using a specific heterocyclic diamine (e.g., 2,5-diaminopyridine) as diamine and polycondensing it with an aromatic tetracarboxylic dianhydride. The polyimide disclosed in Japanese Patent Disclosure (Kokai) No. 61-241325 is prepared by using 9,9-bis(4-aminophenyl)anthracene and paraphenylene diamine as diamines and polycondensing them with biphenyltetracarboxylic dianhydride as a tetracarboxylic dianhydride. These polyimides are prepared by using expensive compound materials such as biphenyltetracarboxylic dianhydride, heterocyclic diamine, or 9,9-bis(4-aminophenyl)anthracene.

SUMMARY OF THE INVENTION

It is an object of the present invention to provide a polyimide which has excellent thermal dimensional stability, and which can be fabricated by using conventional inexpensive materials.

It is another object of the present invention to provide a polyimide having excellent thermal dimensional stability and mechanical properties.

It is still another object of the present invention to provide a polyimide which has excellent mechanical properties and is free from warping or curling when a film composed of this polyimide is bonded to a metal.

According to the present invention there is provided a copolyimide characterized in that the copolyimide contains units represented by formulas (I) and (II)

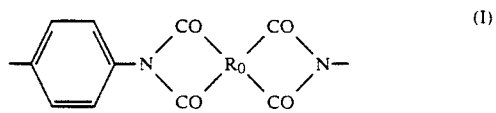

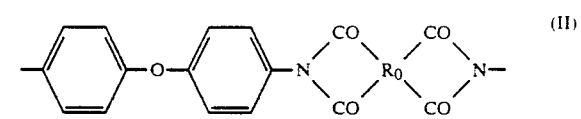

(wherein $R_0$ represents an aromatic tetracarboxylic residue) and is prepared by use of a method characterized by including the steps of:

(a) synthesizing an amic acid prepolymer of acid anhydride group terminals or amino group terminals, by causing an aromatic tetracarboxylic dianhydride to react with a diamine containing 4,4'-diaminophenyl ether and/or paraphenylene diamine at a non-equimolar ratio;

(b) synthesizing polyamic acid having units represented by formula (III) and (IV);

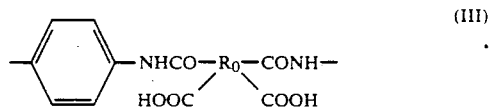

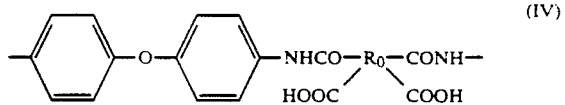

by using the amic acid prepolymer as part or all of the diamine or the acid dianhydride; and (c) dehydrating the polyamic acid to synthesize the polyimide.

DETAILED DESCRIPTION OF THE PREFERRED EMBODIMENTS

An example of a copolyimide of the present invention is one prepared by means of a method which employs the step (a) of synthesizing an amic acid prepolymer of amino group terminals by using a diamine in a molar ratio of more than 1 with respect to an aromatic tetracarboxylic dianhydride. For example, 10 to 90 mol% of aromatic diamine (A with respect to the total diamine is caused to react with 40 to 99 mol% of an aromatic tetracarboxylic dianhydride, with respect to the aromatic diamine (A) in an organic solvent, to obtain the amic acid prepolymer of the amino group terminals. 90 to 10 mol% of aromatic diamine (B) with respect to the total diamine is added to the amic acid prepolymer solution, and the aromatic tetracarboxylic dianhydride is added thereto in such an amount that the total diamine is equimolar with the total aromatic tetracarboxylic dianhydride, whereby copolyamic acid is obtained.

The copolyamic acid solution is casted or coated to form a copolyamic acid film. The film is then dried, and the copolyamic acid is thermally or chemically dehydrated to close the ring (i.e., conversion into an imide). In this way, a copolyimide excellent in dimensional stability and mechanical properties is obtained.

Both 4,4'-diaminodiphenyl ether and paraphenylene diamine are used as indispensable amine components. Diamine (A) or diamine (B) can be 4,4'-diaminodiphenyl ether or paraphenylene diamine, or a mixture thereof. Although it is preferable to use 4,4'-diaminodiphenyl ether and paraphenylene diamine for the diamine component, other amines may be used together with these indispensable amines. When other such amines are used, it is desirable to use 4,4'-diaminodiphenyl ether and paraphenylene diamine in an amount such that the content of momomer units represented by formulas (I) and (II) falls within the range of 50 wt% or more, preferably 80 wt% or more, and more preferably 90 wt% or more in the polyimide molecules.

Another example of a copolyimide of the present invention is one prepared by means of a method which employs the step (a) of synthesizing an amic acid prepolymer of acid anhydride group terminals by using an aromatic tetracarboxylic dianhydride in a molar ratio of more than 1 with respect to a diamine. For example, an aromatic tetracarboxylic dianhydride is caused to react with aromatic diamine (A) in an organic polar solvent at a mole ratio greater than 1, thereby to obtain an amic acid prepolymer having an acid anhydride group at its terminals. Subsequently, aromatic diamine (B) is added to this solution, in an amount such that the total diamine is equimolar with the aromatic tetracarboxylic dianhydride, and reacted to prepare copolyamic acid. Following the same procedures as described above, the copolyamic acid film is produced. The film is then dried, and the copolyamic acid is thermally or chemically dehydrated to close the ring (i.e., conversion into an imide). In this way, a copolyimide excellent in dimensional stability, and mechanical properties is produced. Both 4,4'-diaminodiphenyl ether and paraphenylene diamine are used as indispensable amine components. Diamine (A) or diamine (B) can be 4,4'-diaminodiphenyl ether or paraphenylene diamine, or a mixture thereof. Although it is preferable to use 4,4'y-diaminodiphenyl ether and paraphenylene diamine for diamine component, other amines may be used together with these in dispensable amines. When such other amines are used, it is desirable to use 4,4'-diaminodiphenyl ether and paraphenylene diamine in an amount such that the content of momomer units represented by formulas (I) and (II) falls within the range of 50 wt% or more, preferably 80 wt% or more of such amines, and more preferably 90 wt% or more in the polyimide molecules.

In the polyimide of the present invention, the repetition unit based on paraphenylene diamine represented by formula (I) and the repetition unit based on 4,4'-diaminophenyl ether represented by formula (II) are regularly and uniformly distributed in the molecular chain. As a result, a polyimide excellent in thermal dimensional stability and mechanical properties can be obtained. The polyimide of the present invention is excellent in thermal dimensional stability and mechanical properties as compared with a copolyimide prepared by random polymerization, using paraphenylene diamine and 4,4'-diaminodiphenyl ether as diamines, or a mixture of a homopolymer of a polyimide prepared by using paraphenylene diamine as a diamine and a homopolymer of a polyimide prepared by using 4,4'-diaminodiphenyl ether. The polyimide of the present invention has an elongation of 20% or more for a linear thermal expansion coefficient of $2.5 \times 10^{-5}$/° C. or less (at 50° C. to 300 preferably 40% or more for $2.0 \times 10^{-5}$/° C. or less, and more preferably 50% or more for $1.5 \times 10^{-5}$/° C. Further the polyimide of the present invention has an appropriate modulus.

Polyamic acid and a polyimide which are prepared in the case of the present invention are polymers having the following repetition units.

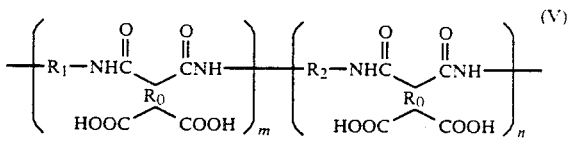

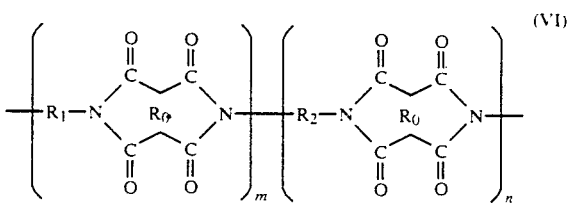

(wherein each of $R_1$ and $R_2$ independently represents a diamine residue selected from 4,4'-diaminodiphenyl ether and paraphenylene diamine, $R_0$ represents a tetracarboxylic residue, and each of m and n independently represents a positive integer). The values of m and n are preferably constant throughout the molecular chain. In particular, when an amic acid prepolymer of the acid anhydride group terminals is used, n or m can be set to be 1 throughout the entire molecular chain. The resultant polyimide is excellent particularly with regard to its mechanical properties. The molecular weight of a copolyimide of the present invention is not limited to a specific value. In favor of physical properties, however, the number average molecular weight preferably falls within the range of 50,000 or more, more preferably 80,000 or more, in particular 100,000 or more, and most preferably 120,000 or more.

Indispensable aromatic diamine components used in the present invention are 4,4'-diaminodiphenyl ether and paraphenylene diamine.

The molar ratio of 4,4'-diaminodiphenyl ether to paraphenylene diamine falls within the range of 1/9 to 9/1, preferably 1/7 to 7/1, and more preferably 1/4 to 4/1.

Examples of the aromatic tetracarboxylic dianhydride are pyromellitic dianhydride, 3,3',4,4'-biphenyltetracarboxylic dianhydride, 3,3',4,4'-benzophenone tetracarboxylic dianhydride, naphthalene-1,2,5,6-dianhydride. These aromatic tetracarboxylic dianhydride components can be used singly or as a mixture. Among these tetracarboxylic dianhydride, pyromellitic dianhydride is preferred.

It is desirable to use pyromellitic dianhydride in an amount such that the content of pyromellitic dianhydride in the total tetracarboxylic dianhydride is 50 wt% or more, preferably 70 wt% or more, and especially 90 wt% or more. In addition to the abovementioned diamine component diamine compounds represented by the following formula:

$$H_2N-R-NH_2$$

(wherein R is an organic group having a valency of 2) Examples of these diamines are 4,4'-bis(4-aminophenoxy) biphenyl, 4,4'-diaminodiphenylsulfone, 3,3'-diaminodiphenylsulfone, bis[4-(4-aminophenoxy)phenyl]sulfone, bis[4-(3-aminophenoxy)phenyl]sulfone, bis[4-(2-aminophenoxy)phenyl]sulfone, 1,4-bis(4-amin benzene, 1,3-bis(4-aminophenoxy)benzene, 1,3-bis(3-aminophenoxy)benzene, 1,4-bis(4-aminophenyl) benzene, bis[(4-aminophenoxy)phenyl]ether, 4,4'-diaminodiphenyl methane, bis(3-ethyl-4-aminophenyl)methane, bis(3-methyl-4-aminophenyl)methane, bis(3-chloro-4-aminophenyl)methane, 3,3'-dimethoxy-4,4'-diaminodiphenyl, 3,3'-dimethyl-4,4'-diaminobiphenyl, 3,3'-dichloro-4,4'-diaminobiphenyl, 2,2',5,5'-tetrachloro-4,4'-diaminobiphenyl, 3,3'-dicarboxy-4,4'-diaminobiphenyl, 3,3'-dihydroxy-4,4'-diaminobiphenyl, 4,4'-diaminodiphenylsulfide, 3,3'-diaminodiphenyl ether, 3,4'-diaminodiphenyl ether, 4,4'-diaminobiphenyl, 4,4'-diaminooctafluorobiphenyl, 2,4-diaminotoluene, methaphenylene diamine, 2,2-bis[4-(4-aminophenxy)phenyl]propane, 2,2-bis[4-(4-aminophenoxy)phenyl]hexafluoropropane, 2,2-bis(4-aminophenyl)propane, 2,2-bis(aminophenyl)hexafluoropropane, 2,2-bis(3-hydroxy-4-aminophenyl)propane 2,2-bis(3-hydroxy-4-aminophenyl) hexafluoropropane, 9,9-bis(4-aminophenyl)-10-hydro-anthoracene, and orthotolidinesulfone. In addition, some multivalent amine compounds such as 3,3',4,4'-biphenyltetraamine, and 3,3',4,4'-tetraaminodiphenyl ether can also be used.

According to the present invention, a method of adding monomers for polymerization is most important.

When the amic acid prepolymer of amino group terminals is used as an intermediate, the amount of diamine (A) used in step (a) containing 4,4'-diaminodiphenyl ether and/or paraphenylene diamine falls within the range of 10 to 90 mol%, preferably 15 to 85 mol%, and more preferably 20 to 80 mol% with respect to the total amount of diamine component. 40 to 99 mol% of the aromatic tetracarboxylic dianhydride with respect to the amount of diamine (A) is caused to react therewith, to obtain an amic acid prepolymer of amino group terminals. To the amic acid prepolymer solution of the amino group terminals, 90 to 10 mol%, preferably 85 to 15 mol%, and more preferably 80 to 20 mol% of diamine (B) used in the step (b) with respect to the total diamine amount and the aromatic tetracarboxylic dianhydride in a equimolar amount to the total amount of diamine are added and reacted therewith, to prepare copolyamic acid. When the amic acid prepolymer of acid anhydride group terminals is used as an intermediate, 50 to 90 mol%, preferably 50 to 87.5 mol%, and more preferably 50 to 80 mol% of diamine (A) used in step (a) containing 4,4'-diaminodiphenyl ether and/or paraphenylene diamine, with respect to the amount of the acid anhydride used in the step (a), are added to the aromatic tetracarboxylic acid dianhydride, to prepare an amic acid prepolymer of acid anhydride group terminals. Diamine (B) used in step (b) is added at an equimolar ratio to the acid anhydride in the prepolymer solution, so as to obtain copolyamic acid.

Examples of intermediates such as amic acid prepolymers of the amino group terminals and the acid anhydride group terminals are compounds represented as follows:

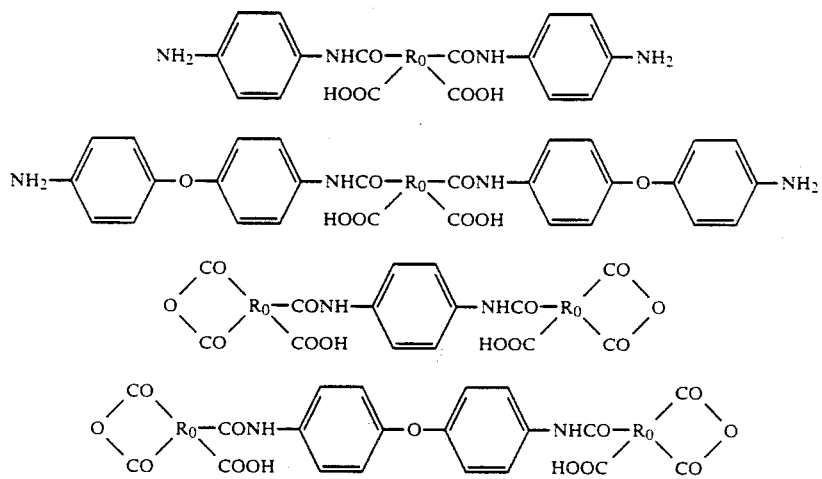

(wherein $R_0$ is as defined above.)

The intermediate may be polyamic acid having a low molecular weight having the amino or acid anhydride group terminals. The number average molecular weight of the amic acid intermediate is less than copolyamic acid as the final product, and is preferably 20,000 or less, and more preferably 10,000 or less.

Examples of the organic solvent used in the reaction for producing copolyamic acid are a sulfoxide solvent (e.g., dimethylsulfoxide or diethylsulfoxide), a formamide solvent (e.g., N,N-dimethylformamide or N,N-diethylformamide), an acetamide solvent (e.g., N,N-dimethylacetamide or N,N-diethylacetamide), a pyrrolidone solvent (e.g., N-methyl-2-pyrrolidone or N-vinyl-2-pyrrolidone), a phenol solvent (e.g., phenol, o-, m- or p-cresol, xylenol, halogenated phenol, or catechol), and an another organic polar solvent (e.g., hexamethylphosphorammide or Y-butyrolactone). These organic solvents are used singly or as a mixture. In addition, an aromatic hydrocarbon such as xylene or toluene may be added to the solvent. 5 to 40 wt%, preferably 5 to 30 wt%, and more preferably 5 to 25 wt% o the copolyamic acid are dissolved in the solvent when handling is also taken into consideration.

The reaction temperature falls within the range of 0 to 100° C., preferably 5 to 80° C., and more preferably 5 to 50° C.

When the amic acid prepolymer of the acid anhydride group terminal is used as an intermediate, the reaction temperature is preferably 30° C or less and more preferably 10° C or less. The reaction time falls within the range of 10 hours or less, preferably 5 hours or less, and more preferably 3 hours or less.

A polyimide can be derived from the resultant copolyamic acid, by use of one of the following two methods:

(i) Thermal dehydration and closing the ring (conversion into an imide)

(ii) Chemical dehydration and closing the ring (conversion into an imide).

According to method (i), a copolyamic acid solution is casted and dried on a support body such as a support plate, a heating drum, or an endless belt, thereby to obtain a self-supporting film. This film is gradually heated to a temperature of about 200 to 500° C, and preferably 300 to 500° C, to obtain a polyimide film.

According to method (ii), a dehydrate such as acetic anhydride and a tertiary amine such as pyridine, pycoline, or quinoline are added to a copolyamic acid solution. Thereafter, a polyimide film is formed following the same procedures as in method (i). When the self-supporting film is to be heated, it may be held on the support body or peeled off therefrom. In the latter case, if the edge of the film is fixed and the film is heated, a copolymer having a low linear thermal expansion coefficient can be obtained. When the method whereby the copolyamic acid is thermally converted into a polyimide is compared with that whereby the copolyamic acid is chemically converted, the chemical method is superior to the thermal method, from the viewpoints of mechanical properties and the linear thermal expansion coefficient.

The copolyimide of the present invention has good thermal dimensional stability as well as good mechanical properties. More specifically, the linear thermal expansion coefficient is $2.5 \times 10^{-5}$ or less, and an elongation is 20% or more.

In addition to its thermal dimensional stability and mechanical properties, the copolyimide of the present invention has a proper modulus. As a result, the copolyimide film can be used effectively as a film-like flexible printed circuit board, a magnetic recording material (especially perpendicular magnetic recording material) such as a magnetic type and a magnetic disk, and as a passivation film for ICs, LSIs, solar cells, and the like.

EXAMPLE 1

10.31 g of 4,4-diaminodiphenyl ether (to hereinafter be referred to as ODA) were charged in a 500-ml four neck flask, and 145.00 g of N,N-dimethylacetamide were added thereto to dissolve the ODA. Meanwhile, 16.90 g of pyromellitic dianhydride (to hereinafter be referred to as PMDA) were added to a 50-ml eggplant type flask and were added in solid form to the ODA solution. The PMDA attached to the inner wall surface of the 50-ml eggplant type flask was dissolved in 10.00 g of N,N-dimethylacetamide, this solution was poured into the reaction system (i.e., the four-neck flask), and the mixture was stirred for one hour, to thereby obtain an amic acid prepolymer of acid anhydride group terminals. 2.79 g of paraphenylene diamine (to hereinafter be referred to as a P-PDA) were charged in a 50-ml Erlenmeyer flask, and 15.00 g of N,N-dimethyleacetamide were added to dissolve the P-PDA. The resultant solution was added to the reaction system (i.e., the four-neck flask), whereby a copolyamic acid solution was obtained. In the above reactions, the reaction temperature was 5 to 10° C, with dry nitrogen gas being used to treat the PMDA was gas and to fill the reaction system.

The polyamic acid solution was casted and coated on a glass plate, was dried at about 100° C for about 60 minutes, after which the resultant polyamic acid film was peeled off the glass plate. Thereafter, the film was fixed in a frame and dried at about 100° C. for 30 minutes, at about 200° C for about 60 minutes, and at about 300° C, again for about 60 minutes. The film was dehydrated and subjected to ring closing, resulting in a polyimide film having a thickness of 15 to 25 μm.

The linear thermal expansion coefficient, the elongation break, and the modulus of the film are summarized in Table 1. Note that the linear thermal expansion coefficient was obtained at 200° C.

EXAMPLE 2

A copolyimide film was obtained following the same procedures as in Example 1, except that 8.07 g of the ODA, 17.58 g of the PMDA, and 4.35 g of the P-PDA were used. The properties of this film are summarized in Table 1.

EXAMPLE 3

4.35 g of P-PDA were charged in a 500-ml four neck flask, and 110.00 g of N,N-dimethylacetamide were added to dissolve the P-PDA. 17.58 g of the PMDA were charged in a 50-ml eggplant type flask and was added in solid form to the P-PDA. The PMDA attached to the inner wall surface of the 50-ml eggplant type flask was dissolved in 10.00 g of N,N-dimethylacetamide, and this solution was poured into the reaction system (i.e., the four neck flask). The resultant mixture was stirred for one hour, to obtain a amic acid prepolymer of acid anhydride group terminals. Meanwhile, 8.07 g of the ODA were charged in a 100-ml Erlenmeyer flask, and 50.00 g of N,N-dimethylacetamide were added thereto to dissolve the ODA. The resultant solution was added to the reaction system (i.e., the four-neck flask), whereby a copolyamic acid solution was obtained. In the above reactions, the reaction temperature was 5 to 10° C, with dry nitrogen gas being used to treat the PDMA and to fill the reaction system. A copolyimide film was obtained following the same procedures as in Example 1. The properties of this film are summarized in Table 1.

EXAMPLE 4

A copolyimide film was obtained following the same procedures as in Example 1, except that 12.02 g of the ODA, 16.36 g of the PMDA, and 1.62 g of the P-PDA were used. The properties of this film are summarized in Table 1.

EXAMPLE 5

A copolyimide film was obtained following the same procedures as in Example 3, except that 6.06 g of the P-PDA, 18.33 g of the PMDA, and 5.61 g of the ODA were used. The properties of this film are summarized in Table 1.

EXAMPLE 6

33.88 g of acetic anhydride and 5.32 g of pyridine were added to the polyamic acid solution obtained by use of the method of Example 2.

The polyamic acid solution composition was casted and coated on a glass plate, and dried at about 100° C. for approximately 10 minutes. The resultant self-supporting film was peeled off the plate and was fixed to a support frame. The film was then heated at about 200° C. for approximately 10 minutes, and at about 300° C. for approximately 20 minutes, resulting in a polyimide film having a thickness of 15 to 25 μm. The properties of this film are summarized in Table 1.

EXAMPLE 7

2.43 g of P-PDA were charged in a 500-ml four-neck flask, and 135.00 g of N,N-dimethyl acetamide were added thereto to dissolve the P-PDA. Meanwhile, 3.92 g of the PMDA were charged in a 100-ml eggplant type flask and added in solid form to the P-PDA solution. The resultant solution was stirred for one hour, to obtain an amic acid prepolymer of amino group terminals. 18.03 g of the ODA were charged in a 50-ml eggplant flask and were added in solid form to the amino group terminal amic acid prepolymer solution, and the solution was sufficiently stirred until the solid ODA was completely dissolved 20.62 g of the additional PMDA were charged in a 100-ml eggplant flask and were added in solid form to the reaction system (i.e., the four-neck flask). Subsequently, the solution was stirred for one hour, whereby a copolyamic acid solution was obtained. The reaction temperature was 5 to 10° C. In the reactions described above, dry nitrogen gas was used to treat the PMDA and to fill the reaction system.

A copolyimide film was prepared from the copolyamic acid solution, following the same procedures as in Example 1. The properties of this film are summarized in Table 1.

EXAMPLE 3

15.47 g of the ODA were charged in a 500-ml four-neck flask, and 255.00 g of N,N-dimethylacetamide were added thereto to dissolve the ODA. Meanwhile, 16.01 g of the PMDA were charged in a 100-ml eggplant flask and were added in solid form to the ODA solution. The solution was stirred for one hour, to obtain an amic acid prepolymer of amino group terminals. 4.19 g of the P-PDA were charged in a 50-ml eggplant flask and were added in solid form to the amino group terminal amic acid prepolymer solution. The solution was sufficiently stirred until the solid P-PDA was completely dissolved. 9.34 g of the additional PMDA were charged in a 100-ml eggplant flask and were added in solid form to the reaction system (i.e., the four-neck flask). The solution was stirred for one hour, whereby a copolyamic acid solution was obtained. The reaction temperature was kept at 5 to 10° C. In the above reactions, dry nitrogen gas was used to treat the PMDA and to fill the reaction system.

47.39 g of acetic anhydride and 9.17 g of pyridine were added to the resultant copolyamic acid solution, and the mixture thoroughly stirred. Following the same procedures as in Example 1, a copolyimide film was prepared from the copolyamic acid solution. The properties of this film are summarized in Table 1.

EXAMPLE 9

12.11 g of the ODA were charged in a 500-ml four-neck flask, and 255.00 g of N,N-dimethylacetamide were added to dissolve the ODA. Meanwhile, 11.88 g of the PMDA were charged in a 100-ml eggplant flask and were added in solid form to the ODA solution. The resultant solution was kept stirred for one hour, to obtain an amic acid prepolymer of amino group terminals. 6.53 g of the P-PDA were charged in a 50-ml eggplant type flask and were added in solid form to the amino group terminal amic acid prepolymer solution, and the resultant solution was sufficiently stirred until the added P-PDA was completely dissolved. 14.49 g of the additional PMDA were charged in a 100-ml eggplant type flask and were added in solid form to the reaction system (i.e., the four-neck flask). The resultant solution was kept stirred for one hour, whereby a copolyamic acid solution was obtained. The reaction temperature was kept at 5 to 10° C. In the above reactions. dry nitrogen gas was used to treat the PMDA and to fill the reaction system.

The resultant copolyamic acid mixture solution was flowed and coated on a glass plate, and dried at about 100° C. for 60 minutes. The copolyamic acid film was then peeled off the glass plate and fixed to a support frame. Thereafter, the film was heated at about 150° C. for approximately 30 minutes, and at about 300° C for 60 minutes, to perform dehydration and ring closing, whereby a copolyimide film having a thickness of 15 to 25 μm was obtained. The properties of this film are summarized in Table 1.

EXAMPLE 10

6.53 g of the P-PDA were charged in a 500-ml four-neck flask, and 255.00 g of N,N-dimethylacetamide were added to dissolve the P-PDA. Meanwhile, 11.86 g of the PMDA were charged in a 100-ml eggplant type flask and were added in solid form to the P-PDA solution. The resultant solution was kept stirred for one hour, to obtain an amic acid prepolymer of amino group terminals. 12.11 g of the ODA were charged in a 50-ml eggplant type flask and were added in solid form to the amino group terminal amic acid prepolymer solution, and the resultant solution was sufficiently stirred until the added ODA was completely dissolved. 14.51 g of the additional PMDA were charged in a 100-ml eggplant type flask and were added in solid form to the reaction system (i.e., the four-neck flask). The resultant solution was kept stirred for one hour, whereby a copolyamic acid solution was obtained. The reaction temperature was kept at 5 to 10° C. In the above reactions, dry nitrogen gas was used to treat the PMDA and to fill the reaction system.

The resultant copolyamic acid mixture solution was casted and coated on a glass plate, and dried at about 100° C. for 60 minutes. The copolyamic acid film was then peeled off the glass plate and fixed to a support frame. Thereafter the film was heated at about 150° C. for approximately 10 minutes, at about 200° C. for approximately 60 minutes, and at about 300° C. for 60 minutes, to perform dehydration and ring closing, whereby a copolyimide film having a thickness of 15 to 25 μm was obtained. The properties of this film are summarized in Table 1.

EXAMPLE 11

8.42 g of the ODA were charged in a 500-ml four-neck flask, and 255.00 g of N,N-dimethylacetamide were added thereto to dissolve the ODA. Meanwhile, 4.59 g of the PMDA were charged in a 100-ml eggplant type flask and were added in solid form to the ODA solution. The resultant solution was kept stirred for one hour, to obtain an amic acid prepolymer of amino group terminals. 9.09 g of P-PDA were charged in a 50-ml eggplant type flask and were added in solid form to the amino group terminal amic acid prepolymer solution, and the solution was sufficiently stirred until the added P-PDA was completely dissolved. 22.91 g of the additional PMDA were charged in a 100-ml eggplant type flask and were added to the above solution, and the resultant solution was kept stirred for one hour, whereby a copolyamic acid solution was obtained. The reaction temperature was kept at 5 to 10° C, and dry nitrogen gas was used to treat the PMDA and to fill the reaction system.

Following the same procedures as in Example 1, a copolyimide film wa prepared from the resultant copolyamic acid solution. The properties of this film are summarized in Table 1.

EXAMPLE 12

6.45 g of the ODA were charged in a 500-ml four-neck flask, and 255.00 g of N,N-dimethylacetamide were added thereto to dissolve the ODA. Meanwhile, 6.32 g of the PMDA were charged in a 100-ml eggplant type flask and were added in solid form to the ODA solution. The resultant solution was kept stirred for one hour, to obtain an amic acid prepolymer of amino group terminals. 10.44 g of P-PDA were charged in a 50-ml eggplant type flask and were added in solid form to the amino group terminal amic acid prepolymer solution, and the solution was sufficiently stirred until the added P-PDA was completely dissolved. 21.79 of the additional PMDA were charged in a 100-ml eggplant type flask and were added in solid form to the above reaction system (the four-neck flask), and the resultant solution was kept stirred for one hour, whereby a copolyamic acid solution was obtained. The reaction temperature was kept at 5 to 10° C, and dry nitrogen gas was used to treat the PDMA and to fill the reaction system.

Following the same procedures as in Example 1, a copolyimide film was prepared from the resultant copolyamic acid solution. The properties of this film are summarized in Table 1.

COMPARATIVE EXAMPLE 1

21.54 g of the ODA were charged in a 500-ml four-neck flask, and 245.00 g of N,N-dimethylacetamide were added thereto to dissolve the ODA. Meanwhile, 23.46 g of the PMDA were charged in a 100-ml eggplant type flask and were added in solid form to the ODA solution. The PMDA attached to the inner wall surface of this 100-ml eggplant type flask was dissolved in 10.00 g of N,N-dimethylacetamide, and this solution was poured into the reaction system (i.e., the four neck flask). The resultant solution was kept stirred for one hour, whereby a polyamic acid solution was obtained. The reaction temperature was kept at 5 to 10° C, and dry nitrogen gas was used to treat the PDMA and to fill the reaction system.

Following the same procedures as in Example 1, a polyimide film was prepared from the resultant polyamic acid solution. The properties of this film are summarized in Table 1.

COMPARATIVE EXAMPLE 2

4.35 g of the P-PDA and 8.07 g of the ODA were charged in a 500-ml four-neck flask, and 160.00 g of N,N-dimethylacetamide were added thereto to dissolve the P-PDA and the ODA. 17.58 g of the PMDA were reacted following the same procedures as in Comparative Example 1, whereby a copolyamic acid solution was produced by random copolymerization. The PMDA attached to the inner wall surface was dissolved in 10.00 g of N,N-dimethylacetamide, and the resultant solution was poured into the reaction system (i.e, the four neck flask).

Following the same procedures as in Comparative Example 1, a copolyimide film was prepared from the polyamic acid solution. The properties of this film are summarized in Table 1.

COMPARATIVE EXAMPLE 3

6.96 g of the P-PDA and 4.30 g of the ODA were charged in a 500-ml four-neck flask and 160.00 g of N,N-dimethylacetamide were added thereto to dissolve the P-PDA and the ODA. 18.73 g of the PMDA were caused to react with what following the same procedures as in Comparative Example 1, whereby a copolyamic acid solution was obtained by random copolymerization. The PMDA attached to the inner wall surface was dissolved in 10.00 g of N,N-dimethylacetamide, and the resultant solution was poured into the reaction system (i.e, the four neck flask).

Following the same procedures as in Comparative Example 1, a copolyimide film was prepared from the polyamic acid solution. The properties of this film are summarized in Table 1.

COMPARATIVE EXAMPLE 4

21.54 g of the ODA were charged in a 500-ml four-neck flask, and 2245.00 g of N,N-dimethylacetamide were added thereto to dissolve the ODA. Meanwhile, 23.46 g of the PMDA were charged in a 100-ml eggplant type flask and were added in the solid form to the ODA solution. The PMDA attached to the inner wall surface of this 100-ml eggplant type flask wa dissolved in 10.00 g of N,N-dimethylacetamide and the resultant solution was poured into the reaction system (i.e., the four neck flask). The solution was kept stirred for one hour, whereby polyamic acid solution (I) was obtained.

14.91 g of the P-PDA were charged in an another 500-ml four-neck flask, and 245.00 g of N,N-dimethylacetamide were added thereto to dissolve the P-PDA. 30.09 g of the PMDA were reacted following the same procedures as described above, whereby polyamic acid solution (II) was obtained. In all the above reactions, the reaction temperature was kept at 5 to 10° C, and dry nitrogen gas wa used to treat the PMDA and to fill the reaction system.

112.35 g of polyamic acid solution (I) were poured into an another 500-ml four-neck flask, and 87.65 g of polyamic acid solution (II) were added thereto and mixed. The mixture was kept stirred at 5 to 10° C. for about 10 minutes in the presence of dry nitrogen gas.

Following the same procedures as in Example 1, a polyimide film was prepared from the polyamic acid mixture solution. The properties of this film are summarized in Table 1.

TABLE 1

| Example | ODA:p-PDA (Molar Ratio) | Amic Acid Prepolymer Terminal Group | Diamine | Diamine:Acid anhydride (Molar Ratio) | Linear Expansion Coefficient (cm/cm/°C.) ($\times 10^{-5}$) | Elongation break (%) | Modulus kg/mm$^2$ |
|---|---|---|---|---|---|---|---|
| Example 1 | 67:33 | Acid Anhydride Group | ODA | 67:100 | 0.89 | 57.0 | 450 |
| Example 2 | 50:50 | ↑ | ODA | 50:100 | 0.30 | 48.0 | 590 |
| Example 3 | 50:50 | ↑ | P-PDA | 50:100 | 0.30 | 48.0 | 580 |
| Example 4 | 80:20 | ↑ | ODA | 80:100 | 0.97 | 72.0 | 410 |
| Example 5 | 33:67 | ↑ | P-PDA | 33:100 | 0.00 | 35.5 | 860 |
| Example 6 | 50:50 | ↑ | ODA | 50:100 | 0.28 | 55.0 | 620 |
| Example 7 | 80:20 | Amino Group | P-PDA | 100:80 | 1.87 | 68.8 | 380 |
| Example 8 | 67:33 | ↑ | ODA | 100:95 | 0.37 | 40.5 | 410 |
| Example 9 | 50:50 | ↑ | ODA | 100:90 | 0.60 | 50.0 | 570 |
| Example 10 | 50:50 | ↑ | P-PDA | 100:90 | 0.11 | 33.8 | 560 |
| Example 11 | 33:67 | ↑ | ODA | 100:50 | −0.62 | 30.4 | 830 |
| Example 12 | 25:75 | ↑ | ODA | 100:90 | −2.55 | 21.1 | 950 |
| Comparative Example 1 | 100:0 | — | — | — | 3.5 | 85.7 | 360 |
| Comparative Example 2 | 50:50 | — | — | — | 0.9 | 20.0 | 550 |
| Comparative Example 3 | 25:75 | — | — | — | 0.20 | 18.0 | 950 |
| Comparative Example 4 | 50:50 | — | — | — | 0.69 | 14.7 | 520 |

What is claimed is:

1. A copolyimide consisting essentially of units represented by formula (I) and units represented by formula (II):

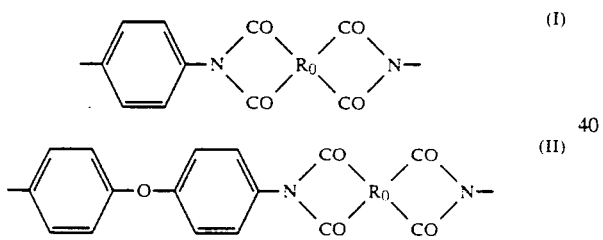

wherein $R_0$ is an aromatic tetracarboxylic acid residue, said copolyimide being prepared by a method comprising the steps of:

(a) reacting the following two components:
  (i) an aromatic tetracarboxylic dianhydride, and
  (ii) a diamine component consisting essentially of at least one diamine selected from the group consisting of 4,4′-diaminoodiphenyl ether and paraphenylene diamine,
  wherein the amount of one of said two components is in molar excess over the amount of the other of said two components, so that the resulting amic acid prepolymer is terminated with groups derived from the component which is inn molar excess;

(b) reacting said amic acid prepolymer with a sufficient amount of at least one of said two components so that the total number of moles of component (i) used in steps (a) and (b) is equal to the total number of moles of component (ii) used in steps (a) and (b), provided that the diamine component added in step (b) contains 4,4′-diaminophenyl ether if the diamine component added in step (a) does not contain 4,4′-diaminophenyl ether, and further provided that the diamine component added in step (b) contains paraphenylene diamine if the amine component added in step (a) does not contain paraphenylene diamine, to give a copolyamic acid consisting essentially of units represented by formula (III) and units represented by formula (IV):

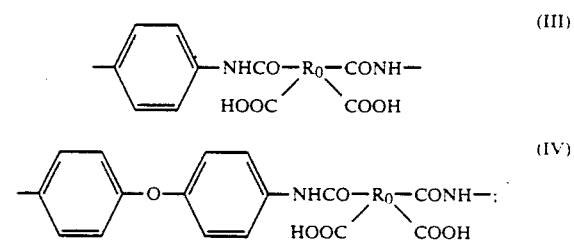

and (c) dehydrating said polyamic acid to obtain said copolyimide.

2. A copolyimide according to claim 1, wherein component (i) is used in molar excess over component (ii) in step (a).

3. A copolyimide according to claim 2, wherein the amount of component (ii) used in step (a) is 10 to 90 mole % of the amount of component (ii) used in steps (a) to (c), and the amount of component (i) used in step (a) is 40 to 99 mole % of the amount of component (i) used in step (a).

4. A copolyimide according to claim 1, wherein component (i) is used in molar excess over component (ii) in step (a).

5. A copolyimide according to claim 1, wherein the component (ii) used in step (a) is 4,4′-diaminodiphenyl ether.

6. A copolyimide according to claim 1, wherein component (ii) used in step (a) is paraphenylene diamine.

7. A copolyimide according too claim 1, wherein the total molar ratio of the unit represented by formula (I)

to the unit represented by formula (II) is in the range 1/9 to 9/1.

8. A copolyimide according to claim 1, wherein the component (i) is pyromellitic dianhydride.

9. A copolyimide according to claim 1, wherein said dehydrating step (c) is thermal dehydration.

10. A copolyimide according too claim 1, wherein said dehydration step (c) is chemical dehydration.

11. A copolyamic acid consisting essentially of units represented by (III) and units represented by formula (IV):

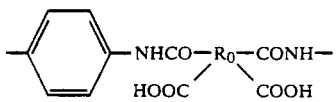
(III)

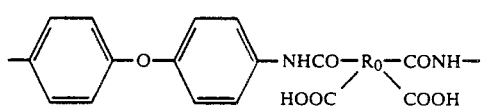
(IV)

wherein $R_0$ is an aromatic tetracarboxylic acid residue, said copolyamic acid being prepared by a method comprising the steps of:

(a) reacting the following two components:
  (i) an aromatic tetracarboxylic dianhydride, and
  (ii) a diamine component consisting essentially of at least one diamine selected from the group consisting of 4,4'-diaminodiphenyl ether and paraphenylene diamine,
  wherein the amount of one of said two components is in molar excess over the amount of the other of said two components, so that the resulting amic acid prepolymer is terminated with groups derived from the component which is in molar excess; and (b) reacting said amic acid prepolymer with a sufficient amount of at least one of said two components so that the total number of moles of component (i) used in steps (a) and (b) is equal to the total number of.moles of component (ii) used in steps (a) and (b), provided that the diamine component added inn step (b) contains 4,4'-diaminophenyl ether if the diamine component added in step (a) does not contain 4,4'-diaminophenyl ether, and further provided that the diamine component added in step (b) contains paraphenylene diamine if the amine component added inn step (a) does not contain paraphenylene diamine, to give said copolyamic acid consisting essentially of units represented by formula (III) and units represented by formula (IV).

12. A method of preparing a copolyimide consisting essentially of units represented by formula (I) and units represented by formula (II):

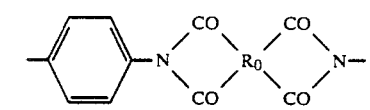
(I)

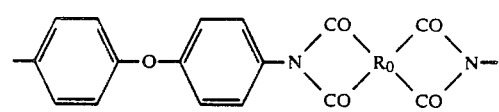
(II)

wherein $R_0$ is an aromatic tetracarboxylic residue, comprising the steps of:

(a) reacting the following two components:
  (i) an aromatic tetracarboxylic dianhydride, and
  (ii) a diamine component consisting essentially of at least one diamine selected from the group consisting of 4,4'-diaminodiphenyl ether and paraphenylene diamine,
  wherein the amount of one of said two components is in molar excess over the amount of the other of said two components, so that the resulting amic acid prepolymer is terminated with groups derived from the component which is in molar excess;

(b) reacting said amic acid prepolymer with a sufficient amount of at least one of said two components so that the total number of moles of component (i) used in steps (a) and (b) is equal to the total number of moles of component (ii) used in steps (a) and (b), provided that the diamine component added in step (b) contains 4,4'-diaminophenyl ether if the diamine component added in step (a) does not contain 4,4'-diaminophenyl ether, and further provided that the diamine component added in step (b) contains paraphenylene diamine if the amine component added in step (a) does not contain paraphenylene diamine, to give a copolyamic acid consisting essentially of units represented by formula (III) and units represented by formula (IV):

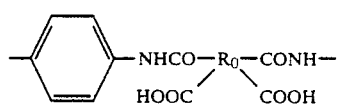
(III)

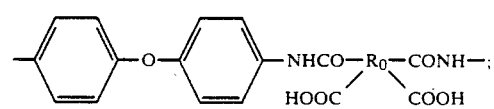
(IV)

and (c) dehydrating said polyamic acid too obtain said copolyimide.

13. A method of preparing a copolyamic acid consisting essentially of units represented by formula (III) and units represented by formula (IV):

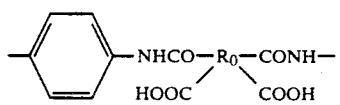
(III)

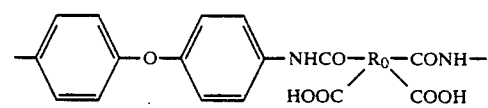
(IV)

wherein $R_0$ is an aromatic tetracarboxylic acid residue, comprising the steps of:

(a) reacting the following two components:
  (i) an aromatic tetracarboxylic dianhydride, and
  (ii) a diamine component consisting essentially of at least one diamine selected from the group consisting of 4,4'-diaminodiphenyl ether and paraphenylene diamine,
  wherein the amount of one of said two components is in molar excess over the amount of the other of said two components, so that the resulting amic acid prepolymer is terminated with groups derived from the component which is in molar excess; and (b) reacting said amic acid prepolymer with a sufficient amount of at least one of said two components so that the total number of moles of component (i) used in steps (a) and (b) is equal to the total number of moles of component (ii) used in steps (a) and (b), provided that the diamine component added in step (b) contains 4,4'-diaminophenyl ether if the diamine component added in step (a) does not contain 4,4'-diaminophenyl ether, and further provided that the diamine component added in step (b) contains paraphenylene diamine if the amine component added in step (a) does not contain paraphenylene diamine, to give said copolyamic acid consisting essentially of units represented by formula (III) and units represented by formula (IV).

* * * * *